US006784103B1

(12) United States Patent
Rao et al.

(10) Patent No.: US 6,784,103 B1
(45) Date of Patent: Aug. 31, 2004

(54) METHOD OF FORMATION OF NANOCRYSTALS ON A SEMICONDUCTOR STRUCTURE

(75) Inventors: Rajesh A. Rao, Austin, TX (US); Tushar P. Merchant, Gilbert, AZ (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/442,500

(22) Filed: May 21, 2003

(51) Int. Cl.[7] .............................................. H01L 21/44
(52) U.S. Cl. ..................... 438/680; 260/263; 260/264; 260/197; 260/201; 260/962; 260/594; 260/257
(58) Field of Search ................................ 438/680, 260, 438/594, 962, 197, 201, 257, 264, 263

(56) References Cited

U.S. PATENT DOCUMENTS

| 5,234,862 | A | * | 8/1993 | Aketagawa et al. | ......... 438/488 |
| 5,830,538 | A |   | 11/1998 | Gates et al. | |
| 5,850,064 | A |   | 12/1998 | Goldstein | |
| 6,001,175 | A | * | 12/1999 | Maruyama et al. | ......... 117/102 |
| 6,060,743 | A |   | 5/2000 | Sugiyama et al. | |
| 6,090,666 | A |   | 7/2000 | Ueda et al. | |
| 6,268,041 | B1 |   | 7/2001 | Goldstein | |
| 6,297,095 | B1 | * | 10/2001 | Muralidhar et al. | ......... 438/257 |
| 6,344,403 | B1 |   | 2/2002 | Madhukar et al. | |
| 6,455,372 | B1 |   | 9/2002 | Weimer | |
| 2003/0183901 | A1 | * | 10/2003 | Kanda et al. | ............... 257/510 |
| 2004/0086640 | A1 | * | 5/2004 | Luo et al. | ................ 427/248.1 |

OTHER PUBLICATIONS

F. Mazen et al., Control of Silicon Quantum Dots nucleation and growth by CVD, Materials Research Society Symposium Proceedings, 2003, pp. F1.9.1–F1.9.6, vol. 737, Material Research Society.
Masato Oishi et al., Fabrication of Silicon Nano–Crystal Dots on $SiO_2$ by Ultrahigh–Vacuum Chemical Vapor Disposition, Materials Research SOciety Symposium Proceedings, 2001, vol. 638, Materials Research Society.
Madhukar, Sucharita et al.; "CVD Growth of Si Nanocrystals on Dielectric Surfaces for Nanocrystal Floating Gate Memory Application"; Materials Research Society Symposium; 2001; F5.2.1–F5.2.6; vol. 638; Materials Research Society.

(List continued on next page.)

*Primary Examiner*—Matthew Smith
*Assistant Examiner*—Igwe U. Anya
(74) *Attorney, Agent, or Firm*—Robert I. King; Michael Balconi-Lamica

(57) ABSTRACT

Nanocrystals (22) are formed in a semiconductor, such as for example, in a memory having a floating gate. A dielectric (18) overlies a substrate (12) and is placed in a chemical vapor deposition chamber (34). A first precursor gas, such as disilane (36), is flowed into the chemical vapor deposition chamber during a first phase to nucleate the nanocrystals (22) on the dielectric with first predetermined processing conditions existing within the chemical vapor deposition chamber for a first time period. A second precursor gas, such as silane, is flowed into the chemical vapor deposition chamber during a second phase subsequent to the first phase to grow the nanocrystals under second predetermined processing conditions existing within the chemical vapor deposition chamber for a second time period.

23 Claims, 3 Drawing Sheets

OTHER PUBLICATIONS

Kawashima, Takayuki et al.; "Monitoring of Silicon Nano–Crystal Formation on $SiO_2$ and on Si 3N 4 in an UHV–VCD System"; Presented at the Materials Research Society 2001 Fall Meeting in the Symposium of Nanoparticulate Materials, Boston, MA; 7 pgs.

Fernandes, A. et al; Memory Characterisics of Si Quantum Dot Devices with $SiO_2$/ALD $Al_2O_3$ Tunneling Dielectrics; Electron Devices Meeting 2001; IEDM Technical Digest International 2001; pp 74.1–74.4.

Baron T., et al.; "Growth by Low Pressure Chemical Vapor Deposition of Silicon Quantum Dots on Insulator for Nanoelectronics Devices"; Materials Research Society Symposium Proc. vol 571; 2000 Materials Research Society; pp 37–42.

De Blauwe, J. et al.; "A Novel, Aerosol–Nanocrystal Floating–Gate Device for Non–Volatile Memory Applications"; Electron Devices Meeting 2000; IEDM Technical Digest International; pp 683–686.

Kamins, Ted; "Polycrystalline Silicon for Integrated Circuits and Displays"; $2^{nd}$ Edition, Kluwer Academic Publishers, 1998; Boston; p 44.

Hu, Y. Z. et la.; Real Time Investigation of Nucleation and Growth of Silicon on Silicon Dioxide Using Silane and Disilane in a Rapid Thermal Processing System; J. Vac. Sci. Technol. B 14(2); Mar./Apr. 1996; pp 744–750.

Leach, W. Thomas; "Cracking Assisted Nucleation in Chemical Vapor Deposition of Silicon Nanoparticles on Silicon Dioxide"; Journal of Crystal Growth; 2002; vol. 240 No. 3–4; pp 415–422.

Application No. 10/231,556 filed Aug. 30, 2002.

* cited by examiner

METHOD OF FORMATION OF NANOCRYSTALS ON A SEMICONDUCTOR STRUCTURE

RELATED APPLICATION

This application is related to:

U.S. patent application Ser. No. 10/231,556, entitled "Method of Forming Nanocrystals In A Memory Device," filed Aug. 30, 2002, and assigned to the assignee hereof.

FIELD OF THE INVENTION

This invention relates generally to semiconductors, and more specifically, to the formation nanocrystal structures for semiconductor optical and memory devices.

BACKGROUND OF THE INVENTION

Memory circuits are frequently implemented with cells having a floating gate transistor wherein the floating gate is formed from a uniform layer of material such as polysilicon. In such structures, a thin tunnel dielectric layer beneath the floating gate presents the problem of charge leakage from the floating gate to the underlying channel through defects in the thin tunnel dielectric layer. Such charge leakage can lead to degradation of the memory state stored within the device and is therefore undesirable. In order to avoid such charge leakage, the thickness of tunnel dielectric is often increased. However, charge transfer across thicker tunnel dielectric requires higher (programming and erasing) voltages for storing and removing charge from the floating gate. In many cases, higher programming voltages require the implementation of charge pumps on integrated circuits in order to increase the supply voltage to meet programming voltage requirements. Such charge pumps consume a significant amount of die area for the integrated circuit and therefore reduce the memory array area efficiency and increase overall costs.

In order to reduce the required thickness of the tunnel dielectric and improve the area efficiency of the memory structures by reducing the need for charge pumps, the uniform layer of material used for the floating gate may be replaced with a plurality of silicon nanocrystals, which operate as isolated charge storage elements. In combination, the plurality of nanocrystals provide adequate charge storage capacity while remaining physically isolated from each other such that any leakage occurring with respect to a single nanocrystal via a local underlying defect does not cause charge to be drained from other nanocrystals (by controlling average spacing between nanocrystals, it can be ensured that there is no lateral charge flow between nanocrystals in the floating gate). As such, thinner tunnel dielectrics can be used in these device structures. The effects of leakage occurring in such thin tunnel dielectric devices does not cause the loss of state information that occurs in devices that include a uniform-layer floating gate.

A limiting factor in fabrication of devices that include floating gates made up of a plurality of nanocrystals relates to controlling of the number density, size, area coverage and uniformity of the nanocrystals within the floating gate structure. The number density of the nanocrystals is important in the determination of the change in the threshold voltage for the device between the states where the floating gate is charged or discharged. Higher densities are desirable as they lead to an increased change in threshold voltage when the number of charges per storage element is fixed. Typically a nanocrystal density of $10^{12}$ cm$^{-2}$ and a mean size of about 5 nm (area fraction of about twenty percent) is desired for optimal device operation. With a limited density of isolated storage elements, the charge density per nanocrystal, or number of carriers that each nanocrystal must retain, is forced to an elevated level. The higher storage density per nanocrystal typically leads to charge loss from individual nanocrystals, thus degrading the overall charge retention characteristics of the floating gate. In addition to this limitation, lower nanocrystal densities require longer programming times as a longer time period is required for forcing subsequent charge carriers into each nanocrystal after an initial carrier has been stored and because lower densities imply smaller charge capture probability for carriers injected from the substrate. Furthermore, the time required for adding subsequent carriers continues to increase as the charge density per nanocrystal is elevated.

In one prior art technique for forming nanocrystals, ion implantation is used to implant silicon atoms into a dielectric material. Following implantation, an annealing step causes these implanted silicon atoms to group together through phase separation to form the nanocrystals. Problems arise using such a technique due to the difficulty in controlling the depth at which the silicon nanocrystals are formed due to the phase segregation in the dielectric material. Because the depth at which the isolation storage elements are formed dramatically affects the electrical characteristics of the resulting device, ion implantation does not provide the level of control desired in a manufacturing situation.

In another prior technique for forming the nanocrystals, a thin layer of amorphous silicon is deposited on the tunnel dielectric material. A subsequent annealing step is used to recrystalize the amorphous silicon into the nanocrystals. In order to produce nanocrystals of a desired density and size, the layer of amorphous silicon should be deposited such that it is on the order of 7–10 angstroms in thickness. Deposition of such thin layers of amorphous silicon is hard to control and therefore impractical in a manufacturing process. In addition to such control issues, additional problems may arise due to preexisting crystalline zones within the amorphous silicon layer. Such preexisting crystallites serve as nucleation sites for crystal growth, which deleteriously interferes with the spontaneous crystal growth desired for formation of the nanocrystals.

In other prior techniques for forming nanocrystals, chemical vapor deposition (CVD) techniques such as low pressure chemical vapor deposition (LPCVD) are used to nucleate and grow the nanocrystals directly on the tunnel oxide using silane and nanocrystal densities of the order of $10^{12}$ cm$^{-2}$ have been reported. In this approach substantial surface modification has to be performed to facilitate nucleation and the nanocrystal density is very sensitive to the deliberately introduced surface bonding modification. This is particularly so in a manufacturing environment where there is often a delay period between the surface modification and the processing of nanocrystals during which time the surface condition can change to an unknown extent. Thus, this approach makes the nanocrystal characteristics very sensitive to the surface bonding structure while a manufacturable solution should be tolerable to a wide range of surface conditions.

Cold wall Ultra High Vacuum Chemical Vapor Deposition (UHVCVD) using a disilane precursor has also been shown to yield nanocrystal densities of the order of $10^{12}$ cm$^{-2}$. Problems with this approach include prohibitively long deposition times with most of the expensive precursor gas wasted as an exhaust material byproduct. This is because the sticking coefficient of disilane is extremely small on oxide surfaces implying a long time to nucleate nanocrystals and is also small on silicon nanocrystals that leads to slow growth.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
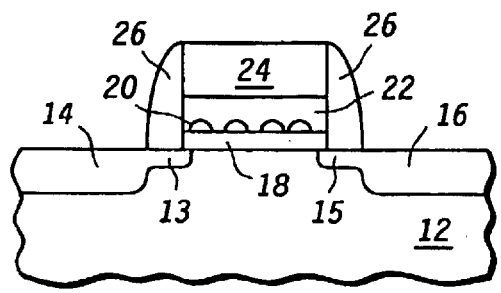
FIG. 1 illustrates in flow diagram form a method of formation of silicon nanocrystals according to one form of the present invention.

FIG. 1 illustrates a process 10 for forming nanocrystals overlying a substrate in accordance with one form of the present invention. In a step 12 a first layer of a substrate of a semiconductor wafer is provided. As used herein, the term "substrate" means one or more layers upon which nanocrystals are to be formed. In the illustrated form, the substrate is both a first layer of substrate material and a second layer that is an overlying dielectric. The substrate may be of various materials. For semiconductor applications, the substrate is typically silicon, germanium or silicon-on-insulator (SOI). However, other substrate materials may be used. The dielectric may be of various materials, such as silicon dioxide, silicon nitride, silicon oxynitride, a high dielectric constant (high k) material and a multilayer dielectric. However, other dielectric materials may be used.

An overlying dielectric material is formed overlying the substrate in a step 14. The dielectric, in one form, is silicon dioxide and is formed on top of the substrate by thermal oxidation of silicon. It should be appreciated that other dielectric material may be used in step 14 instead of $SiO_2$. If the first layer of the substrate is a dielectric, then only one substrate layer maybe implemented. In a step 16, the substrate is placed into a cold wall chemical vapor deposition (CVD) chamber having a wafer or substrate rotating mechanism for rotating the substrate. This will ensure that the deposition process has a circular uniformity.

In a step 18, the substrate temperature is elevated to a first temperature that is within a predetermined temperature range. The predetermined temperature range is for example, 400 to 550 degrees Celsius for silicon nanocrystal formation using a precursor, such as disilane, on $SiO_2$. Other precursor gases may be used. For example, silane, dicholorsilane, etc. may also be used to form silicon nanocrystals. The chamber wall is maintained at a substantially lower temperature. For example, in one form, the chamber wall is approximately 100 degrees Celsius or more lower than the substrate temperature. The desired value of the temperature differential between the chamber wall and the substrate is dependent upon the activation energy for precursor decomposition. The object of this temperature differential is to ensure that gas phase decomposition away from the dielectric layer surface is minimized or eliminated. Such gas phase reaction far from the wafer surface has two undesired consequences. Firstly, gas phase nucleation of reaction products can deposit on the wafer. Secondly, concomitant particulate formation on the chamber walls can lead to defects on the dielectric layer surface.

During the step 18, only a co-flow gas such as hydrogen or an inert gas such as nitrogen or helium is flowed through the chamber and the chamber's pressure maintained at a predetermined value in order to form a boundary layer on the dielectric layer surface. In other words, no reactant gas is introduced into the CVD chamber during step 18. It should be appreciated that in another form the step of introducing the co-flow gas into the cold wall chemical vapor deposition chamber can occur prior to or simultaneously with the step of elevating the substrate temperature.

Within a step 20, a stabilization time period is first allowed to occur to ensure that the substrate's temperature has attained a target value and the pressure in the chamber has stabilized to a desired value. Typically, the pressure of approximately 1–20 Torr is needed to establish an adequate boundary layer overlying the dielectric surface. The flow characteristics are determined by the so-called Knudsen number that represents the ratio of the mean free path of the gas molecules to the characteristic chamber dimensions. For Knudsen numbers less than 0.1, a boundary layer is created and gas molecules within the boundary layer undergo rapid collisions and heat exchange. As such, there is a temperature gradient within the boundary layer. In contrast, for Knudsen numbers larger than about 1 there is no boundary layer formation and gas molecules can be only heated by sporadic collisions with the dielectric layer surface itself. As such, the gas molecules are essentially at the chamber inlet temperature.

At the end of the stabilization period, the reactant precursor molecules are introduced keeping the inert gas flow the same as in the stabilization period. The precursor gas molecules are selectively heated only in the boundary layer that is in the immediate proximity of the wafer surface to form active radicals. In the case of silicon nanocrystal formation using disilane, the boundary layer favors the formation of the active species silylene. In a step 22, the substrate is exposed for a predetermined time to this gas environment to form the silicon nanocrystals.

In a step 24, the reactant gas is turned off and an anneal of the semiconductor device is performed in an inert gas ambient at a second temperature that is higher than the first temperature. This annealing step ensures that any adatoms present in the surface diffuse to existing nanocrystals on the surface of the dielectric. Also, this step 24 facilitates crystallizing the nanoncrystals and equilibriating their geometry. A typical annealing temperature range for this function is approximately between 500 to 900 degrees Celsius, for example, but is at least higher in value than the first temperature. In a step 26, continuation of the semiconductor processing occurs with other steps (not detailed) for the purpose of completing an operational semiconductor device.

Figure 2:
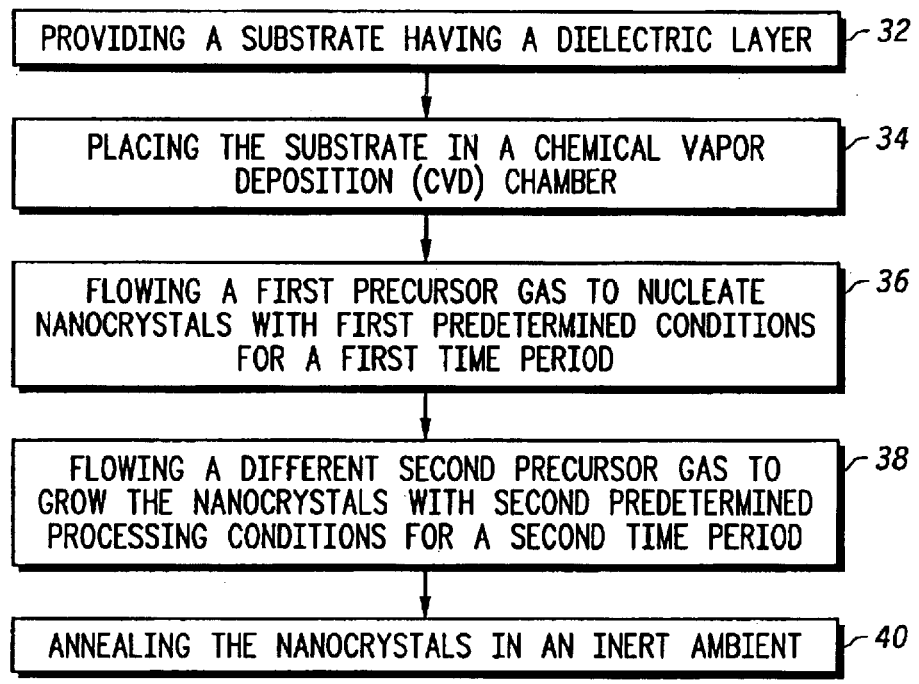
FIG. 2 illustrates in graphical form a nucleation curve illustrating a time evolution of surface characteristics during the method for forming silicon nanocrystals.

Illustrated in FIG. 2 is a typical atomistic nucleation curve 30 that illustrates nanocrystal density as measured by the number of nuclei per square centimeter over a time period measured in seconds. During an incubation time period 32, adatoms begin to form on the dielectric surface as previously described in step 22. These adatoms can be directly deposited from the gas phase (physical vapor deposition) or result from chemical reaction of an active species on the surface (chemical vapor deposition). At this stage these adatoms randomly diffuse on the surface as illustrated in time period 32 of FIG. 2. Once a sufficient concentration of adatoms is achieved in time period 32, collisions between adatoms lead to the formation of atomic clusters which can also disassociate. The smallest cluster that has a greater probability of growth rather than dissociation is called a critical cluster. During this phase, several clusters greater than the critical size are formed in a time period 34 and are termed 'snucleii's. This nucleation time period follows the incubation time period 32. The nucleation does not continue indefinitely and is followed by a growth phase as illustrated in a growth time period 36. During this growth period, no new nuclei are formed, but existing clusters grow by attachment of adatoms.

Figure 3:
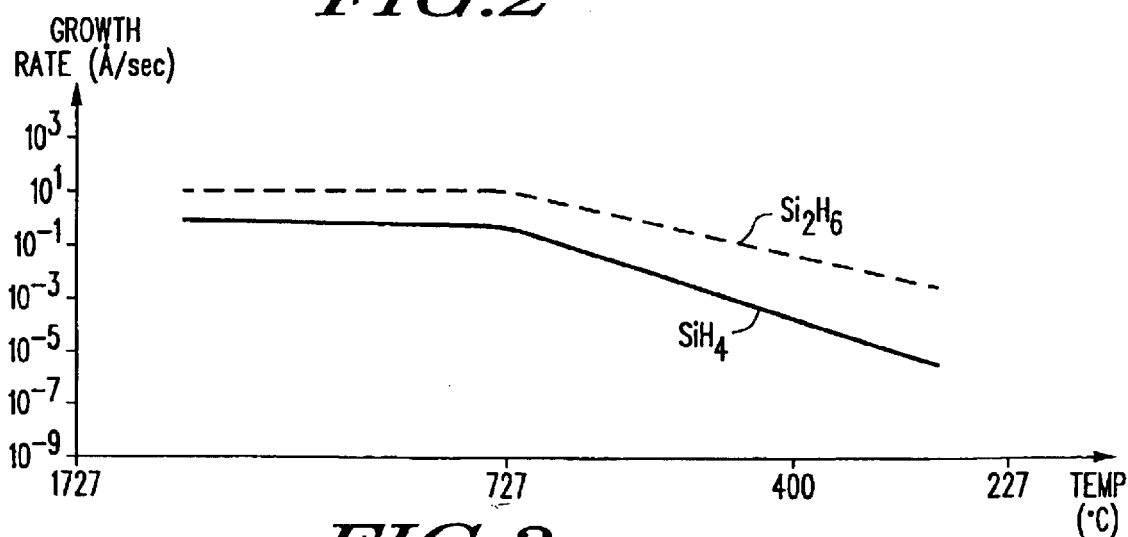
FIG. 3 illustrates in pictorial form a view of nanocrystals and nucleation exclusion zones formed during the method for forming silicon nanocrystals.

The suppression of nucleation arises because each nuclei or nanocrystal is surrounded by a nucleation exclusion zone as shown in FIG. 3. In this nucleation exclusion zone, the adatoms are depleted due to their being captured by the stable nucleus or nanocrystal. When the depletion regions of all the nanocrystals overlap the entire dielectric layer surface area, nucleation is arrested. In a time period 38, the nanocrystals have become so large that contiguous nanocrystals begin to merge or coalesce resulting in a rapid decrease of the nanocrystal density. In summary, the number of nuclei increases with respect to time until a maximum level is reached. Eventually, the nuclei decrease and a continuous amorphous silicon layer is obtained. The critical size and the maximum nanocrystal density are strongly influenced by the rate of formation of adatoms and the surface diffusion characteristics. Higher rates of formation relative to surface diffusion imply a smaller critical size and consequently higher nanocrystal densities. When surface diffusion is high relative to adatom formation, then adatoms can diffuse to existing stable nuclei rather than forming new nuclei. It is thus evident that optimization of the nanocrystal density and size can only be achieved by a careful manipulation of the relative rate of adatom formation to diffusion and hence the optimization is very sensitive to process parameters such as temperature, reactant partial pressure, chamber temperature, chamber pressure, etc. The area coverage of the nanocrystals is important in the determination of the extent of charge isolation of a floating gate of a transistor. For area coverages that are greater than fifty percent, the nanocrystals form an interconnected network that leads to charge percolation from one nanocrystal to another. Lower area coverages, such as less than twenty-five percent, are highly desirable for effective charge isolation.

Figure 4:
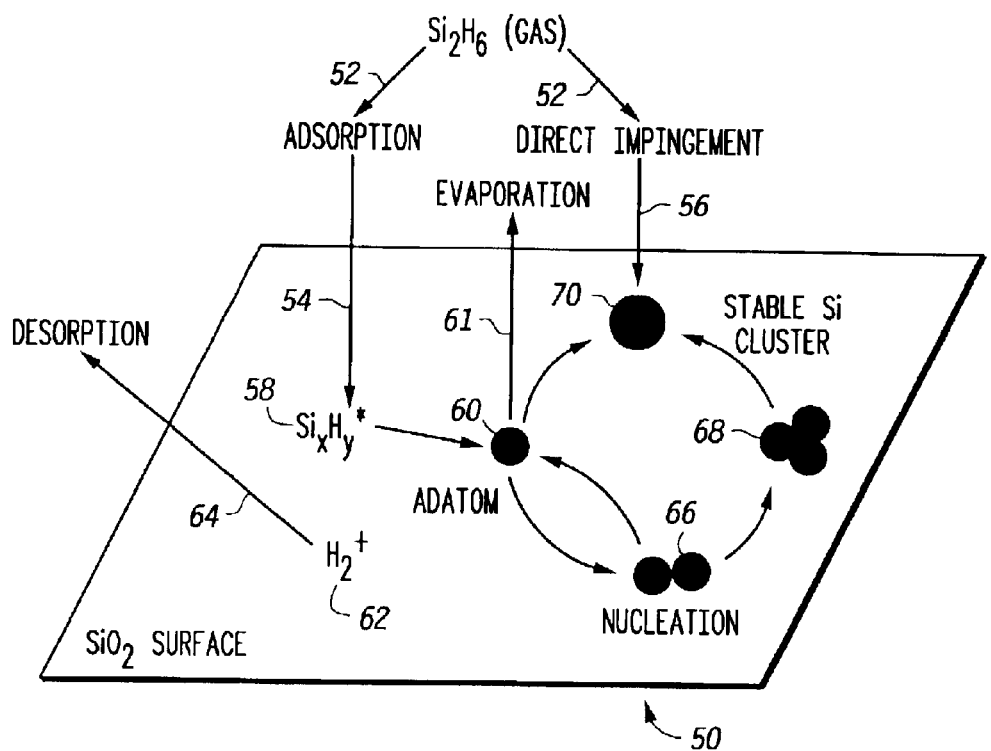
FIG. 4 illustrates in pictorial form a view of atomistic processes. during nucleation by CVD when forming nanocrystals.

Illustrated in FIG. 4 is a microscopic illustration of atomistic processes during silicon nanocrystal formation from a disilane precursor 52 on a silicon dioxide surface of a semiconductor device 50. The precursor molecule, in this case disilane, can directly adsorb on the surface of $SiO_2$ and form a silicon adatom on the surface such as in UHVCVD (Ultra High Vacuum CVD) deposition using a cold wall reactor. However, the sticking coefficient of the disilane is very small (much less than one) and consequently most of the disilane precursor leaves the reactor in an unreacted state. In the illustrated form, the precursor is heated locally near the dielectric layer surface to form an active radical silylene. This active radical has a sticking coefficient close to unity and is adsorbed on the surface as illustrated by step 54. This active radical readily decomposes to form a silicon adatom as illustrated in step 60. Silicon adatoms on the surface diffuse on the surface and due to random encounters form clusters of varying sizes that can also dissociate. The process of forming the stable clusters is step 66 and is termed 'snucleation's. The clustering continues until clusters, step 68, of size greater than a critical size are formed where the critical size is on the order of a few atoms. Stable clusters, such as cluster 70, can grow by diffusion of surface adatoms as illustrated in FIG. 4 by adatom 60 joining cluster 70. Cluster 70 may also grow by direct impingement of the active radical or precursor as illustrated in step 56. Desorption of the reaction byproduct, $H_2$, as illustrated in step 62, occurs in a step 64 of FIG. 4 and is necessary to expose fresh oxide surface for adatom formation. In addition to the above processes, adatom evaporation can occur as illustrated in step 61 and is undesirable as it depletes the surface of adatoms available for nucleation. It should be evident from FIG. 4 that the formation of nanocrystals by atomistic nucleation is a very complex process with complex dependencies on processing conditions.

Figure 5:
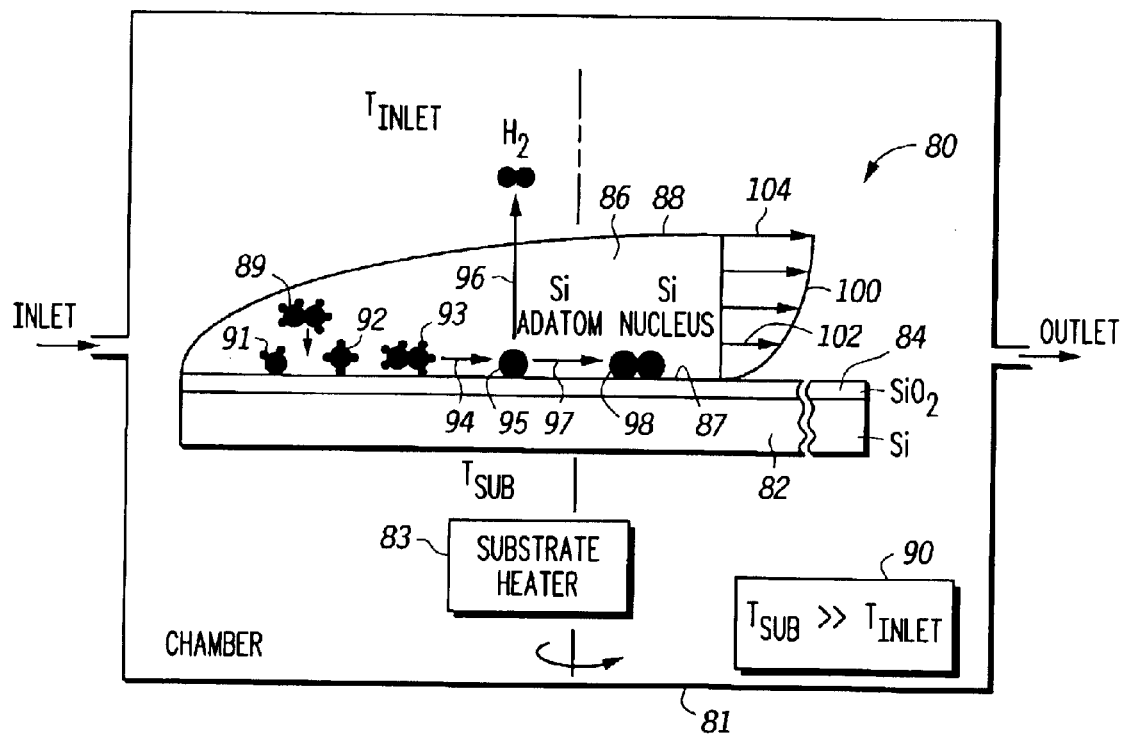
FIG. 5 illustrates in diagrammatic form processes occurring within a thermal boundary layer inside a reactor chamber according to one form of the present invention.

Illustrated in FIG. 5 are processes occurring within a thermal boundary layer inside a reactor chamber. As evident from the discussion of FIG. 4, it is necessary to manipulate the formation rate of adatoms as well as the surface diffusion and atomic reevaporation to get high nanocrystal densities. The boundary layer is a facilitator in achieving the desired formation rate of adatoms. In the illustrated form, a cold wall CVD chamber 81 houses a semiconductor device 80. Semiconductor device 80 rotates within the cold wall CVD chamber 81 about a central vertical axis. The cold wall CVD chamber 81 has an inlet and an outlet for flow of process gases necessary to manufacture the semiconductor device 80. By way of example only, the total pressure within the cold wall CVD chamber 81 is approximately in the range of ten to seventy Torr. The walls of the cold wall CVD chamber 81 are cooled to a temperature much lower than the temperature of a substrate 82. The substrate 82 is heated and maintained at a fixed temperature by a substrate heater 83. By way of example only, the surface temperature is approximately in the range of 400–550 degrees Celsius. The substrate heater 83 may be implemented as a light heat source, a radiant heat source or by other heating elements. As stated in equation 90, the processing described herein assumes that the substrate temperature $T_{SUB}$ is substantially larger than the inlet temperature, $T_{INLET}$, of the cold wall CVD chamber 81. A $SiO_2$ dielectric layer 84 overlies the substrate 82. Formed on dielectric layer 84 is a thermal boundary layer 86. Thermal boundary layer 86 is in a gaseous state. The boundaries 87 and 88 of the thermal boundary layer 86 have temperatures respectively nearly equal to the temperature of substrate 82 and the inlet temperature, $T_{INLET}$. A precursor disilane gas along with a large excess of inert carrier gas, such as $N_2$, enter the cold wall CVD chamber 81 at the inlet and are mixed. By way of example only, the partial pressure of the precursor gas is chosen to be approximately in the range of 10–200 mTorr for silicon nanocrystal formation from disilane. The inlet temperature of the gases typically approximates room temperature. Boundary layer 86 forms in the presence of any flowing gas within the cold wall CVD chamber 81 under conditions where the Knundsen number is less than 0.1. Precursor molecules 89, for example, are heated as they transport across the boundary layer 86 to the upper surface of dielectric layer 84. This heating causes a partial or complete dissociation of disilane. For example, a gas phase decomposition reaction as will be described below is known to occur.

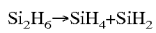

$$Si_2H_6 \rightarrow SiH_4 + SiH_2 \qquad \text{EQUATION (1)}$$

Thus the surface of the dielectric layer 84 is exposed to a mixture of disilane 93, silane 92 and silylene (SiH$_2$) 91. The silylene is a very active species and readily adsorbs on the surface while disilane and silane have substantially lower sticking coefficients and reaction rates on the surface. The adsorbed surface molecules (disilane, silane and silylene) then decompose at the substrate temperature to form silicon adatom 95 during a step 94 and the byproduct H$_2$ is desorbed and removed from the boundary layer into the bulk gas as illustrated in step 96. Surface silicon atoms then nucleate as illustrated in a step 97 to form stable nanocrystal clusters 98.

Further illustrated in FIG. 5 is a gas flow velocity profile 100 in the boundary layer 86. At boundary 87, the top surface of the dielectric layer, the no-slip condition implies that the gas flow velocity 102 is the same as that of the dielectric layer 84. While at boundary 88, the gas flow velocity 104 becomes equal to the mean velocity in the cold wall CVD chamber 81. The boundary layer 86 is an integral component of the deposition method taught herein. The boundary layer 86 is used to create the active species from the precursor near the upper surface of dielectric layer 84 and thereby increase the rate of formation of adatoms at a fixed surface temperature. Absence of a boundary layer 86, such as in a cold wall UHVCVD chamber substantially reduces the rate of formation of adatoms on the dielectric layer surface at the same temperature because of the absence of active species that can be formed in the boundary layer. This typically results in a very long process times that make manufacturing ineffective as well as a substantial waste of precursor gas. Use of a uniformly heated hot walled CVD chamber has its associated problems in nanocrystal formation. In this case, active species are formed not necessarily near the dielectric layer 84 upper surface, but throughout the whole chamber. This leads to an uncontrolled rate of formation of adatoms on the dielectric surface to the extent that surface diffusion mediated nucleation does not occur but an amorphous layer structure is formed. Furthermore, the active species can deposit on the chamber walls and can be a source of defectivity on the dielectric layer surface. In order to ensure that a boundary layer regime is established, the process conditions have to be chosen such that the Knundsen number is less than about 0.1.

Figure 6:
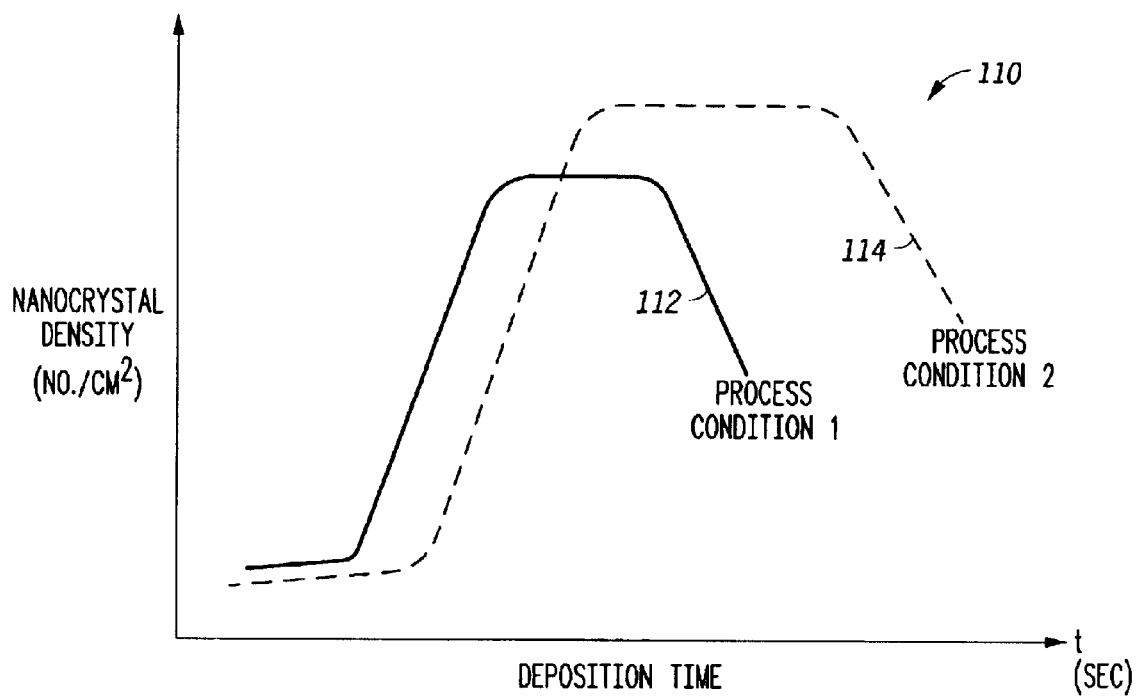
FIG. 6 illustrates in graphical form an influence of process variations on the nucleation curve of FIG. 2.

Illustrated in FIG. 6 is a graph 110 that is a qualitative illustration of the effect of process parameters on the nanocrystal formation. The process conditions such as temperature, precursor partial pressure, chamber pressure and chamber wall temperature influence the critical size of the nucleus as well as the maximum nanocrystal density. For example, a higher temperature on the surface can lead to higher adatom reevaporation, higher surface diffusion and larger critical size resulting in lower nanocrystal densities as illustrated by the curve 112 for process condition 1. Lower surface temperatures can suppress adatom diffusion and reevaporation and reduce the critical size thus leading to higher nanocrystal densities as illustrated by the curve 114 for process condition 2.

By now it should be appreciated that there has been provided a method for optimally forming nanocrystals on a surface of a semiconductor device. The method provides direct CVD deposition of silicon nanocrystals at a reactor pressure of greater than one Torr. A boundary layer in a cold-walled CVD tool is used to preferentially heat a silicon precursor gas, such as disilane, in a region that is near an upper surface of a dielectric overlying a substrate. Partial dissociation of the precursor gas into a silicon containing active species which has a higher sticking coefficient on the dielectric than the precursor gas allows the surface concentration of silicon adatoms to reach sufficient concentration to facilitate nucleation of the silicon adatoms. Most importantly, the sufficient concentration occurs rapidly enough to permit formation of nanocrystals in a short enough time period that allows this method to be cost effective for mass semiconductor manufacturing. There has been disclosed herein a method of forming nanocrystals. A temperature of a substrate within a chamber is elevated to a first temperature in a range sufficient to react a precursor on the substrate surface within the chamber, while maintaining walls of the chamber at a second temperature substantially lower than the first temperature. An inert gas is flowed at a sufficient flow rate within the chamber. A process pressure is maintained in order to form and maintain a thermal boundary layer overlying the surface of the substrate. The precursor is introduced as a reactant gas into the chamber, wherein a portion of the precursor partially dissociates within the thermal boundary layer. Nanocrystals are formed overlying the substrate surface in response to exposing the substrate to the partial dissociation of the precursor gas within the thermal boundary layer within the chamber. The second temperature is at least 100 degrees Celsius lower than the first temperature. The substrate includes a silicon substrate having a dielectric layer overlying the substrate surface, further wherein forming nanocrystals overlying the substrate surface includes forming nanocrystals on the dielectric layer. The dielectric layer 84 includes one selected from the group consisting of a silicon dioxide layer, a silicon nitride layer, a silicon oxynitride layer, a high dielectric constant dielectric layer, and a multilayer dielectric. The high dielectric constant layer includes one selected from the group consisting of a hafnium-, an aluminum-, a zirconium-, a lanthanum-, a hafnium silicate-, a zirconium silicate- and a lanthanum silicate-containing dielectric compound, and combinations thereof. In one form, the dielectric layer 84 includes silicon dioxide, the precursor gas includes disilane or any silicon-containing gas, and a by-product of the partial dissociation includes an active radical silylene that has substantially a unity (i.e. one) sticking coefficient on the SiO$_2$ surface, wherein the silylene provides a source of silicon for forming nanocrystals through nucleation, wherein forming the nanocrystals includes forming silicon adatoms substantially from the active radical silylene, forming silicon nuclei from the silicon adatoms. Silicon nanocrystals are formed from the silicon nuclei. The first temperature is substantially between 400 and 550 degrees Celsius. The precursor gas is introduced into the chamber for a duration on the order of less than five minutes. The precursor gas is introduced into the chamber at a sufficient flow rate to maintain a desired partial pressure of the precursor. The partial pressure of the precursor is substantially in the range of 10 to 200 mTorr. The process pressure is substantially on the order of 1 to 100 Torr. The precursor is introduced into the chamber after a stabilization time period sufficient to stabilize a temperature, pressure, inert gas flow, and thermal boundary layer within the chamber. The precursor includes disilane. The precursor includes any silicon containing gas. The precursor includes any germanium containing gas. The precursor includes any metal containing gas. Flowing the inert gas includes one selected from the group consisting of nitrogen, hydrogen, argon, helium and combinations thereof. The thermal boundary layer overlies the surface of the substrate and between the substrate surface and a bulk gas region within the chamber. The thermal boundary layer region is conducive for partial dissociation of the precursor in the proximity of the substrate surface only. The substrate is rotated about an axis perpendicular to the substrate surface sufficient for providing process uniformity across the substrate. The chamber includes a cold wall CVD chamber. A substrate heater elevates the temperature of the substrate within the chamber to a first temperature. The flow of reactant gas is discontinued to stop a growth of nanocrystals. The nanocrystals are annealed by exposing the substrate surface to an inert gas flow at a third temperature higher than the first temperature and the substrate is cooled.

In the foregoing specification, the invention has been described with reference to specific embodiments. However, one of ordinary skill in the art appreciates that various modifications and changes can be made without departing from the scope of the present invention as set forth in the claims below. For example, although the boundary layer 86 is illustrated as being formed on an upper surface of a dielectric, the boundary layer 86 may be formed on an upper surface of a substrate or on any other layer.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language).

What is claimed is:

1. A method of forming nanocrystals comprising:
   elevating a temperature of a substrate within a chamber to a first temperature in a range sufficient to react a precursor gas on a surface of the substrate within the chamber, while maintaining walls of the chamber at a second temperature substantially lower than the first temperature;
   rotating the substrate about an axis perpendicular to the source of the substrate sufficient for providing process uniformity across the substrate;
   flowing a co-flow gas at a sufficient flow rate within the chamber and maintaining a process pressure in order to form and maintain a thermal boundary layer overlying the surface of the substrate;
   introducing the precursor gas as a reactant gas into the chamber, wherein a portion of the precursor gas partially dissociates within the thermal boundary layer; and
   forming nanocrystals overlying the surface of the substrate in response to exposing the substrate to a partial dissociation of the precursor gas within the thermal boundary layer within the chamber.

2. The method of claim 1, wherein the second temperature is at least 100 degrees Celsius lower than the first temperature.

3. The method of claim 1, wherein the substrate includes a silicon substrate having a dielectric layer overlying the surface of the substrate, further wherein forming nanocrystals overlying the surface of the substrate includes forming nanocrystals on the dielectric layer.

4. The method of claim 3, wherein the dielectric layer includes one selected from the group consisting of a silicon dioxide layer, a silicon nitride layer, a silicon oxynitride layer, a high dielectric constant dielectric layer, and a multilayer dielectric.

5. The method of claim 4, wherein the high dielectric constant dielectric layer includes one selected from the group consisting of a hafnium-, an aluminum-, a zirconium, a lanthanum-, a hafnium silicate-, a zirconium silicate-, a lanthanum silicate-containing dielectric compound, and combinations thereof.

6. The method of claim 3, further wherein the dielectric layer comprises silicon dioxide, and the precursor gas comprises disilane, and a by-product of partial dissociation of the precursor gas comprises an active radical silylene that has a substantially unity sticking coefficient on a SiO2 surface of the dielectric layer, wherein the active radical silylene provides a source of silicon for forming nanocrystals through nucleation, wherein forming the nanocrystals comprises:
   forming silicon adatoms substantially from the active radical silylene;
   forming silicon nuclei from the silicon adatoms; and
   forming silicon nanocrystals from the silicon nuclei.

7. The method of claim 6, further wherein the first temperature is substantially between 400 and 550 degrees Celsius.

8. The method of claim 6, further wherein the precursor gas is introduced into the chamber for a duration on the order of less than five minutes.

9. The method of claim 6, further wherein the precursor gas is introduced into the chamber at a sufficient flow rate to maintain a predetermined partial pressure of the precursor gas.

10. The method of claim 9, further wherein the predetermined partial pressure of the precursor gas is substantially in the range of 10 to 200 mTorr.

11. The method of claim 6, further wherein the process pressure is substantially on the order of 1 to 100 Torr.

12. The method of claim 1, wherein the precursor gas is introduced into the chamber after a stabilization time period sufficient to stabilize a temperature, pressure, co-flow gas flow, and thermal boundary layer within the chamber.

13. The method of claim 1, wherein the precursor gas includes disilane.

14. The method of claim 1, wherein the precursor gas includes any metal containing gas.

15. The method of claim 1, wherein flowing the co-flow gas comprises flowing hydrogen or an inert gas selected from the group consisting of nitrogen, argon, helium and combinations thereof.

16. The method of claim 1, wherein the thermal boundary layer overlies the surface of the substrate, between the surface of the substrate and a bulk gas region within the chamber, the thermal boundary layer further being conducive for partial dissociation of the precursor gas only in a proximity of the surface of the substrate.

17. A method of forming nanocrystals comprising:

elevating a temperature of a substrate within a chamber to a first temperature in a range sufficient to react a precursor gas on a surface of the substrate within the chamber, while maintaining walls of the chamber at a second temperature substantially lower than the first temperature;

flowing a co-flow gas at a sufficient flow rate within the chamber and maintaining a process pressure in order to form and maintain a thermal boundary layer overlying the surface of the substrate by maintaining a ratio of a mean free path of gas molecules of the co-flow gas to chamber dimensions to be less than one;

introducing the precursor gas as a reactant gas into the chamber, wherein a portion of the precursor gas partially dissociates within the thermal bound layer;

forming nanocrystals overlying the surface of the substrate in response to exposing the substrate to a partial dissociation of the precursor gas within the thermal boundary layer within the chamber.

18. A method of forming nanocrystals comprising:

elevating a temperature of a substrate within a chamber to a first temperature in a range sufficient to react a precursor gas on a surface of the substrate within the chamber, while maintaining walls of the chamber at a second temperature substantially lower than the first temperature;

flowing a co-flow gas at a sufficient flow rate within the chamber and maintaining a process pressure in order to form and maintain a thermal boundary layer overlying the surface of the substrates;

introducing the precursor gas as a reactant gas into the chamber, wherein a portion of the precursor gas partially dissociates within the thermal boundary layer;

forming nanocrystals overlying the surface of the substrate in response to exposing the substrate to a partial dissociation of the precursor gas within the thermal boundary layer within the chamber;

annealing the nanocrystals by exposing the surface of the substrate to an inert gas flow at a third temperature higher than the first temperature; and cooling the substrate.

19. A method of forming nanocrystals comprising:

elevating a temperature of a substrate within a chamber to a first temperature in a range sufficient to react a precursor gas on a surface of the substrate within the chamber, while maintaining walls of the chamber at a second temperature substantially lower than the first temperature, wherein the second temperature is at least 100 degrees Celsius lower than the first temperature;

flowing a co-flow gas at a sufficient flow rate within the chamber and maintaining a process pressure in order to form and maintain a thermal boundary layer overlying the surface of the substrate;

introducing the precursor gas as a reactant gas into the chamber, wherein a portion of the precursor gas partially dissociates within the thermal boundary layer; and forming nanocrystals overlying the surface of the substrate in response to exposing the substrate to partial dissociation of the precursor gas within the thermal boundary layer within the chamber, wherein the substrate includes a silicon substrate having a dielectric layer overlying the surface of the substrate, further wherein forming nanocrystals overlying the substrate surface includes forming nanocrystals on the dielectric layer, further wherein the dielectric layer includes silicon dioxide, and a by-product of the partial dissociation includes an active radical silylene that has a substantially unity sticking coefficient on a SiO2 surface of the dielectric layer, wherein the active radical silylene provides a source of silicon for forming nanocrystals through nucleation, wherein forming the nanocrystals includes forming silicon adatoms substantially from the active radical silylene, forming silicon nuclei from the silicon adatoms; and forming silicon nanocrystals from the silicon nuclei, further wherein the first temperature is substantially between 400 and 550 degrees Celsius, further wherein the precursor gas is introduced into the chamber at a sufficient flow rate to maintain a desired partial pressure of the precursor gas, wherein the desired partial pressure of the precursor gas is substantially in the range of 10 to 200 mTorr, further wherein the process pressure is substantially on the order of 1 to 100 Torr.

20. The method of claim 19 further comprising implementing the precursor gas as any silicon-containing gas.

21. The method of claim 19, wherein flowing the co-flow gas includes flowing hydrogen or an inert gas selected from the group consisting of nitrogen, argon, helium and combinations thereof.

22. A method of forming nanocrystals comprising:

elevating a temperature of a substrate within a cold wall CVD chamber to a first temperature in a range sufficient to react a precursor gas on a surface of the substrate within the cold wall CVD chamber, while maintaining walls of the cold wall CVD chamber at a second temperature substantially lower than the first temperature, wherein the second temperature is at least 100 degrees Celsius lower than the first temperature;

flowing a co-flow gas at a sufficient flow rate within the cold wall CVD chamber and maintaining a process pressure in order to form and maintain a thermal boundary layer overlying the surface of the substrate;

introducing the precursor gas as a reactant gas into the cold wall CVD chamber, wherein a portion of the precursor gas partially dissociates within the thermal boundary layer, wherein the precursor gas includes any metal containing gas; and forming nanocrystals overlying the surface of the substrate in response to exposing the substrate to partial dissociation of the precursor gas within the thermal boundary layer within the cold wall CVD chamber.

23. A method of forming nanocrystals comprising:

elevating a temperature of a substrate within a chamber to a first temperature in a range sufficient to react a precursor gas on a surface of the substrate within the chamber, while maintaining walls of the chamber at a second temperature substantially lower than the first temperature;

flowing a co-flow gas at a sufficient flow rate within the chamber and maintaining a process pressure in order to four and maintain a gaseous state thermal boundary layer overlying the surface of the substrate, the gaseous state thermal boundary having a first boundary overlying the substrate and having approximately the first temperature, the gaseous state thermal boundary having a second boundary overlying the first boundary and below an upper inner surface of the chamber, the second boundary of the gaseous state thermal boundary having a third temperature that is approximately equal to temperature at an inlet of the chamber;

introducing tie precursor gas as a reactant gas into the chamber, wherein a portion of the precursor gas partially dissociates within the gaseous state thermal boundary layer; and forming nanocrystals overlying the surface of the substrate in response to exposing the substrate to a partial dissociation of the precursor gas within the gaseous state thermal boundary layer within the chamber.

* * * * *

UNITED STATES PATENT AND TRADEMARK OFFICE
CERTIFICATE OF CORRECTION

PATENT NO. : 6,784,103 B1
DATED : August 31, 2004
INVENTOR(S) : Rao et al.

It is certified that error appears in the above-identified patent and that said Letters Patent is hereby corrected as shown below:

Column 9,
Line 9, change "source" to -- surface --.

Column 13,
Line 20, change "tie" to -- the --.

Signed and Sealed this

Twenty-second Day of November, 2005

JON W. DUDAS
*Director of the United States Patent and Trademark Office*